United States Patent
Horidan et al.

(10) Patent No.: US 7,719,601 B2
(45) Date of Patent: May 18, 2010

(54) IMAGE PICKUP APPARATUS AND MOBILE PHONE

(75) Inventors: Atsushi Horidan, Kanagawa (JP); Satoshi Imai, Kanagawa (JP)

(73) Assignee: Sony Corporation (JP)

( * ) Notice: Subject to any disclaimer, the term of this patent is extended or adjusted under 35 U.S.C. 154(b) by 451 days.

(21) Appl. No.: 11/728,979

(22) Filed: Mar. 27, 2007

(65) Prior Publication Data

US 2007/0263115 A1 Nov. 15, 2007

(30) Foreign Application Priority Data

Mar. 31, 2006 (JP) ............................ 2006-099827

(51) Int. Cl.
*H04N 5/225* (2006.01)
(52) U.S. Cl. ...................... 348/340; 348/335
(58) Field of Classification Search ................. 348/335, 348/340, 360, 375; 359/699, 811; 396/72
See application file for complete search history.

(56) References Cited

U.S. PATENT DOCUMENTS

| | | | | |
|---|---|---|---|---|
| 6,371,613 | B1 * | 4/2002 | Lee | 351/90 |
| 6,724,541 | B2 * | 4/2004 | Noguchi | 359/700 |
| 6,778,218 | B1 * | 8/2004 | Higuchi et al. | 348/344 |
| 2005/0080199 | A1 * | 4/2005 | Kitahara | 525/331.9 |
| 2006/0007351 | A1 | 1/2006 | Choi et al. | |
| 2006/0216014 | A1 | 9/2006 | Morinaga et al. | |
| 2007/0115565 | A1 * | 5/2007 | Shyu et al. | 359/811 |

FOREIGN PATENT DOCUMENTS

| | | |
|---|---|---|
| JP | 54-158192 A | 12/1979 |
| JP | 2002-098878 A | 4/2002 |
| JP | 2003-037758 | 2/2003 |
| JP | 2005-051524 A | 2/2005 |
| JP | 2005-354150 A | 12/2005 |
| JP | 2006-235575 A | 9/2006 |
| JP | 2006-251653 A | 9/2006 |
| JP | 2006-309049 A | 11/2006 |
| JP | 2007-133254 A | 5/2007 |
| WO | 2005/040886 | 5/2005 |
| WO | 2007/040933 | 4/2007 |

OTHER PUBLICATIONS

Japanese Office Action translation dated May 11, 2009, issued in Japanese Patent Application No. 2006-099827.

* cited by examiner

*Primary Examiner*—Tuan Ho
(74) *Attorney, Agent, or Firm*—Lerner, David, Littenberg, Krumholz & Mentlik, LLP (57) ABSTRACT

An image pickup apparatus may include an imaging optical system operative to adjust a focal position of images corresponding to light incident from a lens, a frame arranged movably in an optical axial direction of light incident to the imaging optical system for fixing the imaging optical system by covering the periphery of the imaging optical system, a drive unit operative to move the frame in the optical axial direction to an arbitrary position within a predetermined range, an image pickup device operative to receive light incident through the imaging optical system so as to output a signal corresponding to the received light, and an urging unit inserted between a pedestal base having the image pickup device attached thereto and the frame for urging the frame in the optical axial direction as well as in a direction remote from the image pickup device.

10 Claims, 10 Drawing Sheets

IMAGE PICKUP APPARATUS AND MOBILE PHONE

CROSS-REFERENCE TO RELATED APPLICATIONS

This application claims priority from Japanese Patent Application No. JP 2006-099827 filed in the Japanese Patent Office on Mar. 31, 2006, the entire content of which is incorporated herein by reference.

BACKGROUND OF THE INVENTION

1. Field of the Invention

The present invention relates to image pickup apparatuses and mobile phones, and in particular it relates to a small-sized image pickup apparatus and mobile phone capable of achieving a high-quality imaging function with low cost.

2. Description of the Related Art

Recently, a small-sized thin image pickup apparatus has been widely used so as to be mounted on a small portable electronic instrument such as a mobile phone and a PDA (personal digital assistant). As a result, not only speech information but also image information can be simply transmitted.

In such an image pickup apparatus built in a small portable electronic instrument, because of its small size, a focal length of an imaging optical system is extremely reduced, and the aperture F-value may be set at about 2 to 4 for increasing a shutter speed so as to prevent camera shake. Hence, the depth of focus on the image side is extremely reduced, so that the accuracy in positioning the imaging optical system in the optical axial direction relative to an imaging plane is severely demanded.

Elements on the light receiving section of an image pickup device for photo-electric conversion in the image pickup apparatus are arranged at a pitch of several micro-meters. Thereby, even if a miniature body, such as dust, exists on the image pickup apparatus, an object luminous flux is shielded, impairing picking up object images, so that dust proof of the image pickup apparatus becomes an important challenge.

Under such situations, in regard to the positional setting method and the dust proof method of an imaging optical system of the image pickup apparatus, various techniques have been proposed. For example, a technique is disclosed in that for eliminating the focus adjustment during manufacturing the image pickup apparatus, an image pickup device and an optical component are positioned in an optical axial direction by making a leg formed integrally with the optical component abut the image pickup device so as to urge the optical component in the image pickup device direction with an elastic member such as a coil spring while measures for dust proof being taken (see Japanese Unexamined Patent Application Publication No. 2003-37758, for example).

SUMMARY OF THE INVENTION

However, as the number of mobile phones having image pickup apparatuses will be further increased, it is assumed that the higher image quality taken by the image pickup apparatus be increasingly required. For example, the image pickup apparatus having the image pickup device with the larger number of pixels is demanded. Accordingly, the pixel pitch is further reduced due to the increase in number of pixels of the image pickup device, so that the tolerable area for dust adherent on the light receiving plane of the image pickup device is extremely reduced. That is, by now even if small dust invisible by naked eyes adheres, an object luminous flux is shielded to affect image data.

In the technique of Japanese Unexamined Patent Application Publication No. 2003-37758, dust (micro-metallic pieces, for example) may be generated when micro-vibration is applied for a long time or due to contact abrasion of the leg of the optical component with the partition of a mirror frame or with the image pickup device along with impact during dropping, so as to adhere on the top surface of the image pickup device.

When the imaging optical system is moved for zooming or close-up picturing, the mechanical connection may be required between an operational member or a drive member for moving the imaging optical system and the imaging optical system. External dust may penetrate through the connection so as to also affect image data.

Furthermore, dust may also penetrate through the clearance of the coil spring for urging the optical component.

The present invention has been made in view of such situations, and it is desirable to achieve a small-sized imaging function having high image quality with low cost.

An image pickup apparatus according to a first embodiment of the present invention may include an imaging optical system operative to adjust a focal position of images corresponding to light incident from a lens, a frame arranged movably in an optical axial direction of light incident to the imaging optical system for fixing the imaging optical system by covering the periphery of the imaging optical system, a drive unit operative to move the frame in the optical axial direction to an arbitrary position within a predetermined range, an image pickup device operative to receive light incident through the imaging optical system so as to output a signal corresponding to the received light, and an urging unit inserted between a pedestal base having the image pickup device attached thereto and the frame for urging the frame in the optical axial direction as well as in a direction remote from the image pickup device.

Preferably, the urging unit may include an elastic member with predetermined elasticity.

Preferably, the elastic member may be made of cyclized rubber.

Preferably, the rubber may include a spring built therein.

Preferably, the elastic member may be made of cyclized and foamed rubber.

Preferably, the urging unit may be inserted between a surface of the pedestal base, on which the image pickup device is attached, and an end face of the frame adjacent to the image pickup device.

Preferably, the frame may be shaped to gradually reduce the diameter of part of the frame, and the part of the frame is inserted into part of the pedestal base, and the urging unit is inserted between the part of the frame surface and an inclined surface shaped on the pedestal base.

According to the first embodiment, the frame may be arranged movably in an optical axial direction of light incident to the imaging optical system, which adjusts a focal position of images corresponding to light incident from a lens, for fixing the imaging optical system by covering the periphery of the imaging optical system is moved by the drive unit in the optical axial direction to an arbitrary position within a predetermined range. The urging unit may be inserted between a pedestal base having the image pickup device, which receives light incident through the imaging optical system so as to output a signal corresponding to the received light, attached thereto and the frame for urging the frame in the optical axial direction as well as in a direction remote from the image pickup device.

A mobile phone having an image pickup apparatus built therein according to a second embodiment, in which the image pickup apparatus may include an imaging optical system operative to adjust a focal position of images corresponding to light incident from a lens, a frame arranged movably in an optical axial direction of light incident to the imaging optical system for fixing the imaging optical system by covering the periphery of the imaging optical system, a drive unit operative to move the frame in the optical axial direction to an arbitrary position within a predetermined range, an image pickup device operative to receive light incident through the imaging optical system so as to output a signal corresponding to the received light, and an urging unit inserted between a pedestal base having the image pickup device attached thereto and the frame for urging the frame in the optical axial direction as well as in a direction remote from the image pickup device.

According to the second embodiment, the image pickup apparatus built in the mobile phone may include the imaging optical system adjusting a focal position of images corresponding to light incident from a lens, the frame arranged movably in an optical axial direction of light incident to the imaging optical system for fixing the imaging optical system by covering the periphery of the imaging optical system, the drive unit moving the frame in the optical axial direction to an arbitrary position within a predetermined range, and the image pickup device receiving light incident through the imaging optical system so as to output a signal corresponding to the received light, and the frame is urged in the optical axial direction as well as in a direction remote from the image pickup device by the urging unit inserted between a pedestal base having the image pickup device attached thereto and the frame.

According to the embodiment of the present invention, a small-sized image pickup apparatus may be achieved with high image quality and low cost.

DETAILED DESCRIPTION

Embodiments of the present invention will be described below. The correspondent relationship between constituent features of the present invention and the embodiment described in the specification or the drawings will be shown as follows. This description will serve the purpose of confirming that the embodiment supporting the present invention is described in the specification or the drawings. Hence, even if there is an embodiment being not corresponding to the constituent features of the present invention but described in the specification or the drawings, this does not mean that the embodiment does not correspond to the constituent features. Conversely, even if the embodiment is described to correspond to the constituent features, this does not mean that the embodiment does not correspond to other constituent features.

An image pickup apparatus according to a first embodiment of the present invention includes an imaging optical system adjusting the focal position of images of light incident from a lens (a first lens 101 and a second lens 102 of FIG. 4, for example); a frame (a lens frame 104 of FIG. 4, for example) arranged movably in an optical axial direction of light incident to the imaging optical system for fixing the imaging optical system by covering its periphery; a drive unit (a cam cylinder 105 of FIG. 4, for example) for driving the frame in the optical axial direction to an arbitrary position within a range set in advance; an image pickup device (an image pickup device 107 of FIG. 4, for example) for receiving light incident through the imaging optical system so as to output a signal corresponding to the received light; a pedestal base (a pedestal base 106 of FIG. 4, for example) having the image pickup device attached thereto; and urging means (an elastic member 111 of FIG. 4, for example) inserted into the midst of the frame for urging the frame in the optical axial direction as well as in a remote direction from the image pickup device.

In the image pickup apparatus having a shape of part of the frame with a decreasing diameter, the part of the frame is inserted into part of the pedestal base, so that the urging means can be inserted in between a surface of the part of the frame (a surface 104g of FIG. 8, for example) and an inclined surface (a surface 106g of FIG. 8, for example) provided in the pedestal base.

Figure 10A:
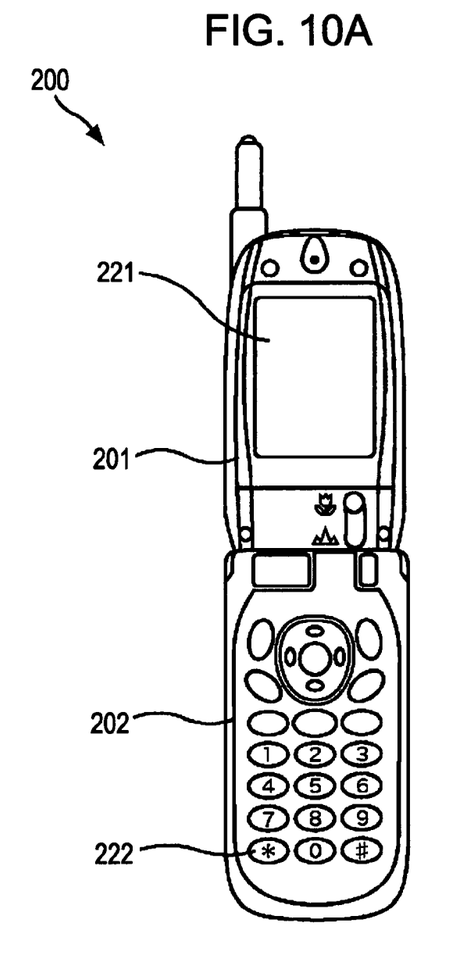
FIGS. 10A and 10B are drawings of an example of a mobile phone having the image pickup apparatus according to the embodiment of the present invention mounted thereon.
Figure 10B:
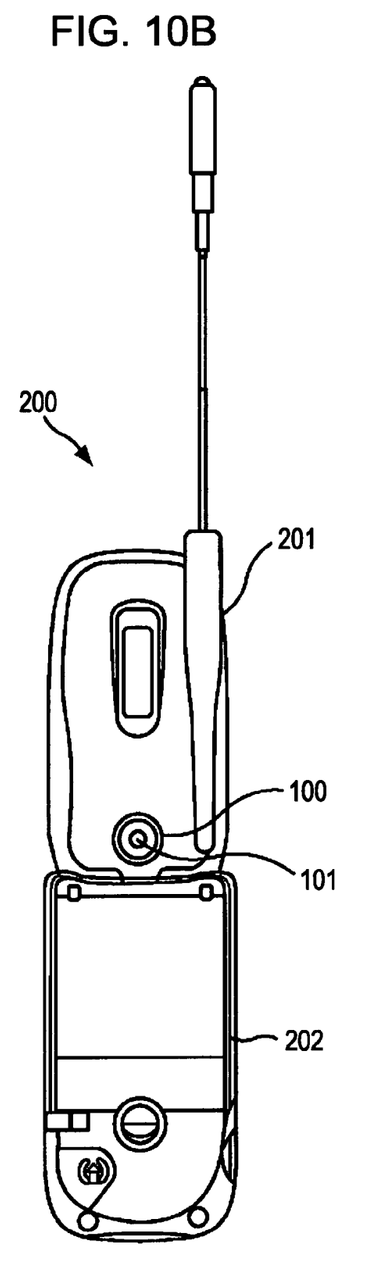

A mobile phone according to a second embodiment of the present invention includes a mobile phone having an image pickup apparatus built therein (a mobile phone 200 of FIG. 10, for example). The image pickup apparatus includes the imaging optical system adjusting the focal position of images of light incident from the lens (the first lens 101 and the second lens 102 of FIG. 4, for example); the frame (the lens frame 104 of FIG. 4, for example) arranged movably in an optical axial direction of light incident to the imaging optical system for fixing the imaging optical system by covering its periphery; the drive unit (the cam cylinder 105 of FIG. 4, for example) for driving the frame in the optical axial direction to an arbitrary position within a range set in advance; the image pickup device (the image pickup device 107 of FIG. 4, for example) for receiving light incident through the imaging optical system so as to output a signal corresponding to the received light; the pedestal base (the pedestal base 106 of FIG. 4, for example) having the image pickup device attached thereto; and the urging means (the elastic member 111 of FIG. 4, for example) inserted into the midst of the frame for urging the frame in the optical axial direction as well as in a remote direction from the image pickup device.

Embodiments of the present invention will be described below with reference to the drawings.

Figure 1:
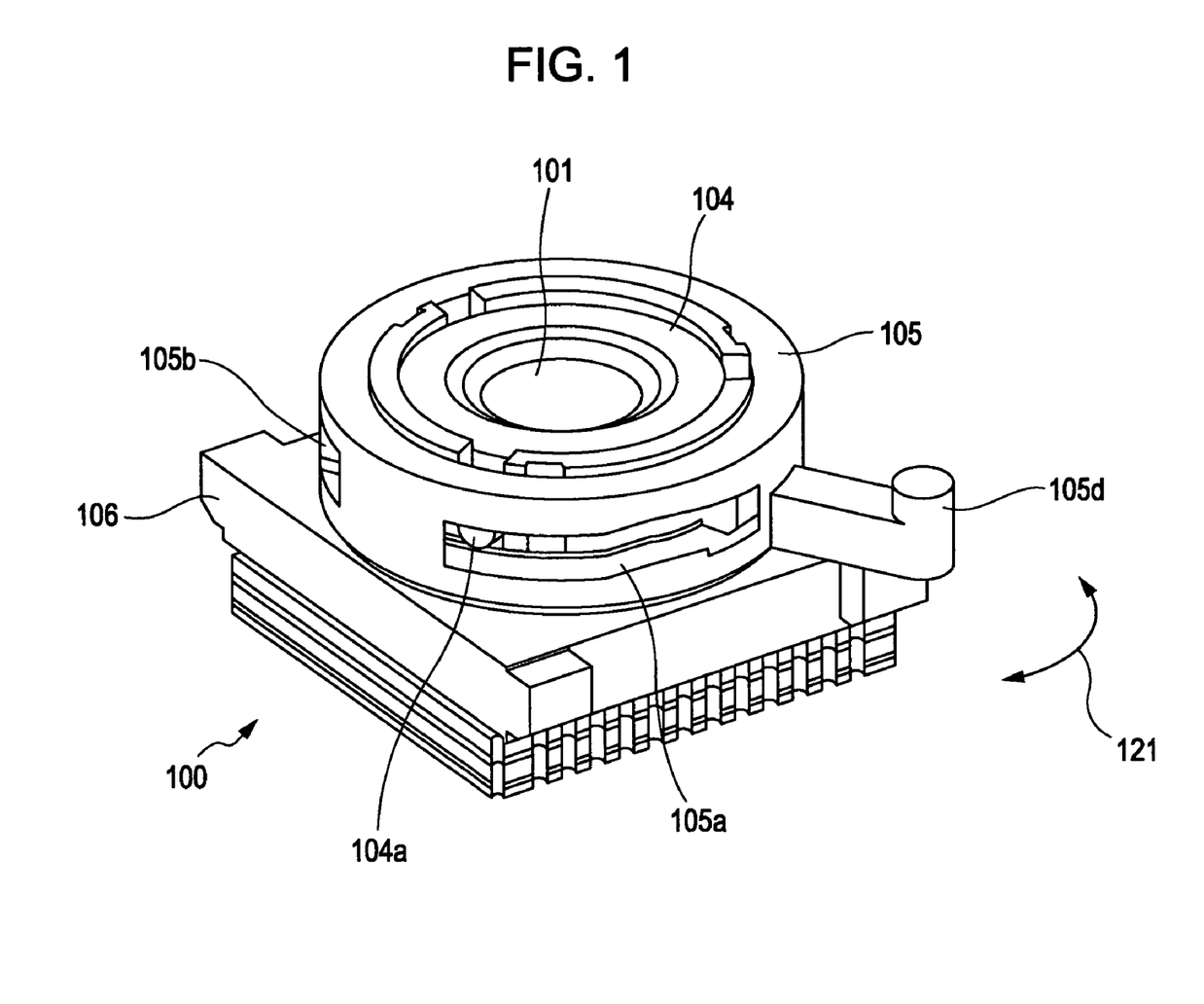
FIG. 1 is an external perspective view of an image pickup apparatus according to an embodiment of the present invention.

FIG. 1 is an external perspective view of an image pickup apparatus according to an embodiment of the present invention.

An image pickup apparatus 100 shown in FIG. 1 is structured in a small size sufficient enough for being mountable on a small portable electronic instrument such as a mobile phone and a PDA (personal digital assistant). The image pickup apparatus 100 includes therein an image pickup device having two-dimensionally arranged photo-electric transducers including a CCD (charge coupled device) image sensor and a C-MOS (complementary metal-oxide semiconductor) image sensor so as to output a signal corresponding to the light received with the receiving plane of the image pickup device as well as corresponding to the picked up images.

The image pickup device is arranged below the pedestal base 106 so that the light passing through the first lens 101 and the second lens 102 (not shown) is incident on the receiving plane of the image pickup device.

The first lens 101 and the second lens 102 are fixed to the cylindrical lens frame 104, and the lens frame 104 is inserted into part of the cylindrical pedestal base 106 movably in the vertical direction in the drawing along a shape of part of the pedestal base 106. The cam cylinder 105 is also cylindrically shaped so as to cover the external surface of the lens frame 104. The cam cylinder 105 is rotatable about the optical axis of light incident on the first lens 101, so that the cam cylinder 105 is rotated by a user moving a lever 105d in arrow 121 directions.

The cam cylinder 105 is provided with a cam hole 105a, a cam hole 105b having the same shape of the cam hole 105a, and a cam hole 105c arranged in the back side of the drawing and having the same shape of the cam hole 105a. The arrangements of the linear cam holes 105a to 105c are not that their distance from the upper or lower end face of the cam cylinder 105 is constant but that the right end of each hole is closer to the pedestal base 106 while the left end is remote therefrom.

The lens frame 104 includes pins 104a to 104c (pins 104b and 104c not shown) for inserting into the cam holes 105a to 105c, respectively. When the cam cylinder 105 is rotated as mentioned above, the cam cylinder 105 is rotated in a state that upper and lower surfaces of the pins 104a to 104c abut those of the cam holes 105a to 105c, respectively.

Figure 2:
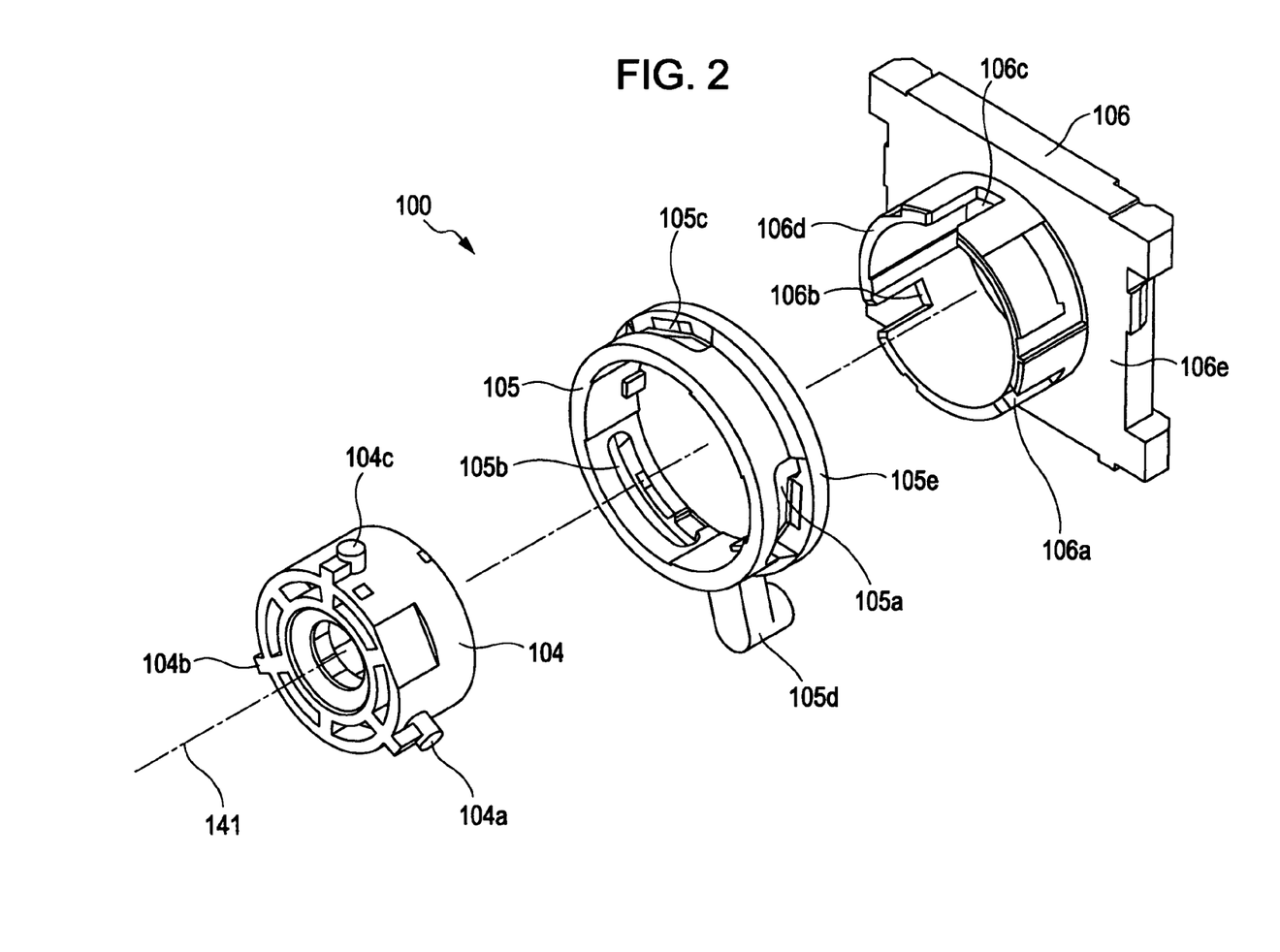
FIG. 2 is a structural drawing of the image pickup apparatus shown in FIG. 1.

FIG. 2 is a structural perspective view of the image pickup apparatus 100 shown in FIG. 1.

As shown in the drawing, the lens frame 104 is inserted into the inside of a cylindrical fixing part 106d of the pedestal base 106 so that the respective positions of the pins 104a to 104c of the lens frame 104 agree with those of cut-in parts 106a to 106c of the pedestal base 106. Hence, in the image pickup apparatus 100, the lens frame 104 is movable in the direction of an optical axis 141 in a state that the cut-in parts 106a to 106c abut the pins 104a to 104c, respectively, inside the fixing part 106d of the pedestal base 106. The drawing is shown as that the first lens 101 is removed from the lens frame 104 for convenience sake.

Outside the fixing part 106d having the lens frame 104 inserted thereinto, the cam cylinder 105 is further fitted. At this time, as mentioned above, the pins 104a to 104c of the lens frame 104 are inserted into the cam holes 105a to 105c, respectively. The position of the cam cylinder 105 in the optical axial direction 141 is fixed so that the back face 105e abuts the surface 106e of the pedestal base 106. Furthermore, as mentioned above, the cam cylinder 105 is rotatable about the optical axis 141 by a user moving the lever 105d.

Thus, when the cam cylinder 105 is rotated, the respective positions of the pins 104a to 104c are moved closer to the pedestal base 106 or remote therefrom according to the respective profiles of the cam holes 105a to 105c, so that by rotating the cam cylinder 105, the lens frame 104 can be moved together with the first lens 101 and the second lens 102 in the optical axial direction 141.

That is, in the image pickup apparatus 100, by operating the lever 105d, the focal position of light incident via the lens can be adjusted.

Figure 3:
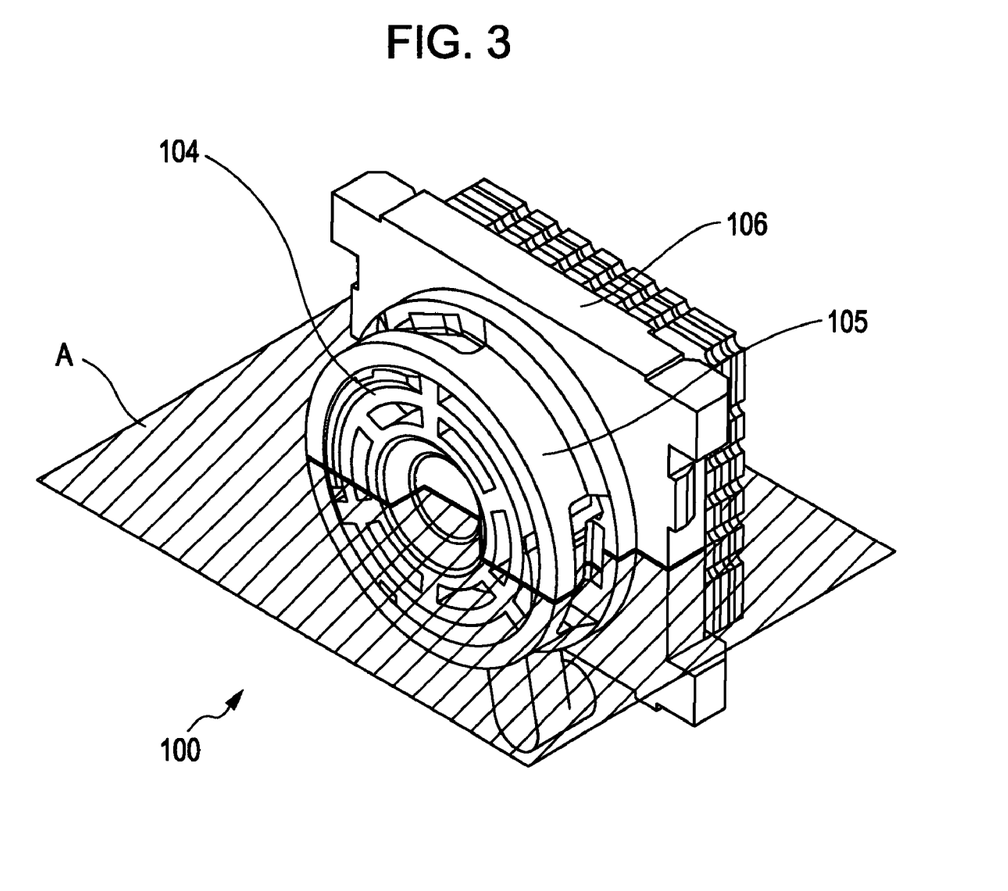
FIG. 3 is a drawing of the image pickup apparatus shown in FIG. 1 viewed at a different angle.

FIG. 3 is a drawing of the image pickup apparatus 100 shown in FIG. 1 viewed at a different angle, and in this drawing, the above-mentioned pedestal base 106, the cam cylinder 105, and the lens frame 104 are also shown. The drawing is shown as that the first lens 101 is removed from the lens frame 104 for convenience sake.

Figure 4:
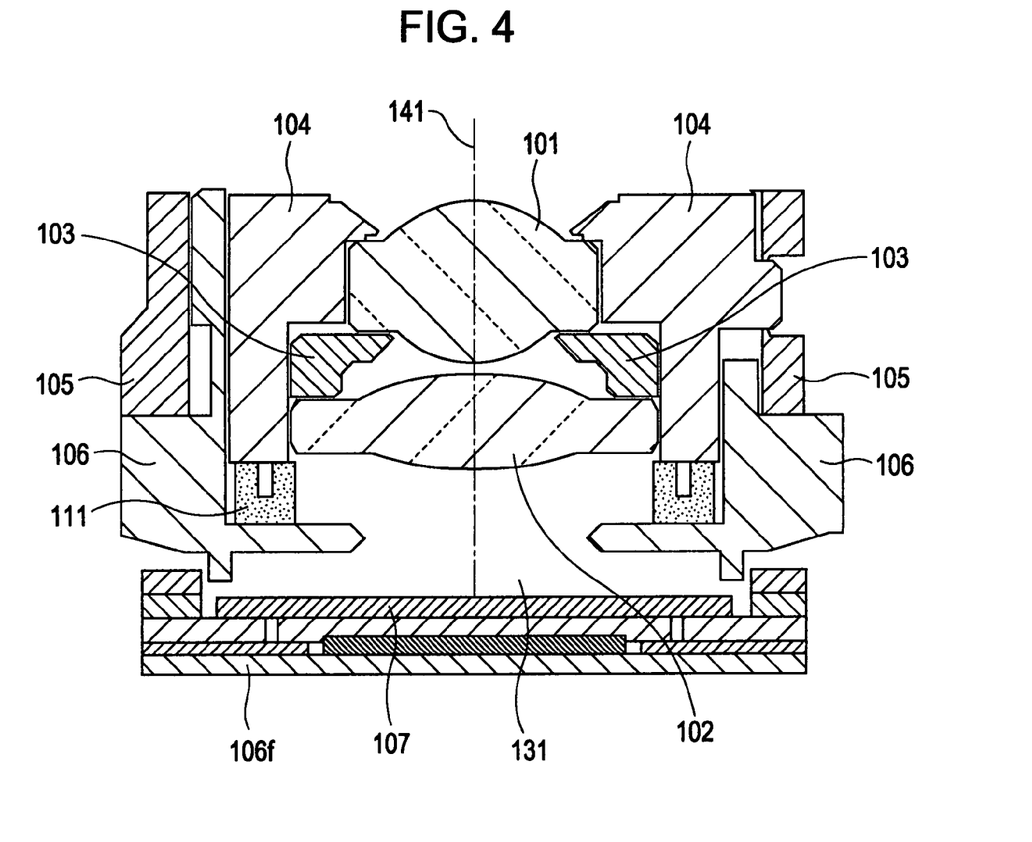
FIG. 4 is a sectional view of the image pickup apparatus shown in FIG. 3.

FIG. 4 is a sectional view of the image pickup apparatus 100 at the plane A of FIG. 3.

In the drawing, the image pickup device 107 is adhered to the bottom face 106f of the pedestal base 106. The image pickup device 107 is composed of two-dimensionally arranged large number of photo-electric transducers such as the CCD and the C-MOS. The space between the photo-electric transducers arranged in the image pickup device 107 is minute so that the image pickup device is able to pickup images with the large number of pixels. In the drawing, the upper face of the image pickup device 107 is the light receiving section, and the image pickup device 107 is arranged so that the center of the light receiving section passes through the optical axis 141.

A diaphragm 103 is provided so as to optimally adjust the diameter of a luminous flux incident on the second lens 102. In the image pickup apparatus 100, the focal position of the images of incident light is adjusted by the first lens 101 and the second lens 102 attached to the lens frame 104.

As mentioned above, the image pickup apparatus 100 is structured in an enough small size by assuming to be built in a small portable electronic instrument, such as a mobile phone, so that the focal length of the imaging optical system composed of the first lens 101 and the second lens 102 is set to be enough small. Also, in the image pickup apparatus 100, the aperture F-value is set at about 2 to 4 for increasing a shutter speed so as to prevent camera shake, so that the depth of focus on the image side is extremely reduced. Hence, the accuracy in positioning the imaging optical system in the optical axial direction relative to the light receiving section (surface adjacent to the second lens 102) of the image pickup device 107 is severely demanded.

As mentioned above, in the image pickup apparatus 100, when the lens frame 104 is moved in the optical axial direction 141 by the rotation of the cam cylinder 105, the first lens 101 and the second lens 102, which are fixed to the lens frame 104, are also moved. Thereby, in the image pickup apparatus 100, by the movement of the lens frame 104 in the optical axial direction 141, the optical axis 141 of the imaging optical system is aligned relative to the light receiving section (surface adjacent to the second lens 102) of the image pickup device 107. Therefore, when images are picked up by the image pickup apparatus 100, it is necessary that the lens frame 104 can be moved by a minute distance so that the images of light incident through the first lens 101 and the second lens 102 are located at an appropriate focal position as well as the lens frame 104 can be securely fixed at a position corresponding to the appropriate focal position.

Then, in the image pickup apparatus 100 according to the embodiment of the present invention, the elastic member 111 is inserted between the lens frame 104 and the pedestal base 106. According to the embodiment, the ring-shaped elastic member 111 has a diameter similar to that of the lens frame 104 and a concave section. It is made of a material with predetermined elasticity, such as foamed rubber, foamed moltopren, sponge, and rubber having a built-in spring. The elastic member 111 is fixed on the surface 106e adjacent to the lens frame 104 inside the fixing part 106d of the pedestal base 106 mentioned above.

Thereby, the lens frame 104 is typically urged by the elastic member 111 upwardly from the lower side (the side of the pedestal base 106) in the drawing at any position in the optical axial direction 141. Since the pins 104a to 104c are inserted into the cam holes 105a to 105c, respectively, the lens frame 104 may not be upward moved across a predetermined position even if it is urged upwardly in the drawing. In such a manner, the lens frame 104 can be freely moved by a minute distance in the optical axial direction 141 as well as the lens frame 104 can be securely fixed at a position in the optical axial direction 141 corresponding to the appropriate focal position.

While the lens frame 104 moves within a predetermined range with the rotation of the cam cylinder 105 in the optical axial direction 141 (vertical directions in the drawing), the elastic member 111 continues to urge the lens frame 104 upwardly in the drawing even if the lens frame 104 is located at any position in the optical axial direction 141. That is, the size (vertical dimension in the drawing) of the elastic member 111 is large enough for urging the lens frame 104 upwardly in the drawing even if the lens frame 104 is located at a position remotest from the pedestal base 106.

In the image pickup apparatus 100 capable of picking up images with the large number of pixels, while the high accuracy in positioning the imaging optical system in the optical axial direction is demanded as described above, the many photo-electric transducers on the light receiving section of the image pickup device 107 are arranged so as to have an extremely small space (pitch) between transducers adjacent to each other, so that sufficient countermeasure may be required for preventing foreign materials from entering a luminous flux incident to the image pickup device 107 through the first lens 101 and the second lens 102 along the optical axial direction 141. For example, even if small dust invisible by naked eyes enters a space 131 between the image pickup device 107 and the second lens 102, an object luminous flux is shielded to affect images to be picked up. Furthermore, the consider is needed not to affect images to be picked up, even if dust, such as micro-metallic pieces, is generated when micro-vibration is applied for a long time or due to contact abrasion between the lens frame 104 and the fixing part 106d of the pedestal base 106 along with impact during dropping or between the pins 104a to 104c and faces to be abutted along with the rotation of the cam cylinder 105.

In the image pickup apparatus 100 according to the embodiment of the present invention, the elastic member 111 is used for positioning the imaging optical system. As described above, the elastic member 111 is made of a material, such as foamed rubber, foamed moltopren, sponge, and rubber having a built-in spring, and is attached by making its upper end face in the drawing abut the lens frame 104 while making its lower end face in the drawing abut the pedestal base 106. Thereby, differently from a case using a coil spring, the clearance between the lens frame 104 and the pedestal base 106 is sealed so as to hermetically seal the space 131 between 107 and the second lens 102, preventing dust from entering the space 131.

Since the elastic member 111 is inserted between the lens frame 104 and the pedestal base 106 so as to urge the lens frame 104 upwardly in the drawing, the dust proof can be achieved more efficiently. For example, although the positioning is possible by urging the lens frame 104 from the upper side of the drawing; in this case, the lower end face of the lens frame 104 in the drawing abuts the upper end face (surface 106e) in the drawing of the pedestal base 106.

Thus, contact abrasion between the lens frame 104 and the pedestal base 106 and metallic pieces (dust) due to the abrasion may be generated so that the dust enters the space 131 in this case.

Whereas, the image pickup apparatus 100 according to the embodiment of the present invention is structured so that components may not come in contact with each other within the space 131, thereby securely suppressing the penetration of dust into the space 131.

In such a manner, in the image pickup apparatus 100 according to the embodiment of the present invention, the positioning of the imaging optical system in the optical axial direction can be performed with high accuracies as well as dust proof measures are taken for preventing foreign materials including minute dust from entering between the imaging optical system and the image pickup device. As a result, beautiful images can be taken with high image quality.

The sectional shape of the elastic member is not limited to that shown in FIG. 4; other shapes can be taken as long as they can urge the lens frame 104 as mentioned above.

Figure 5:
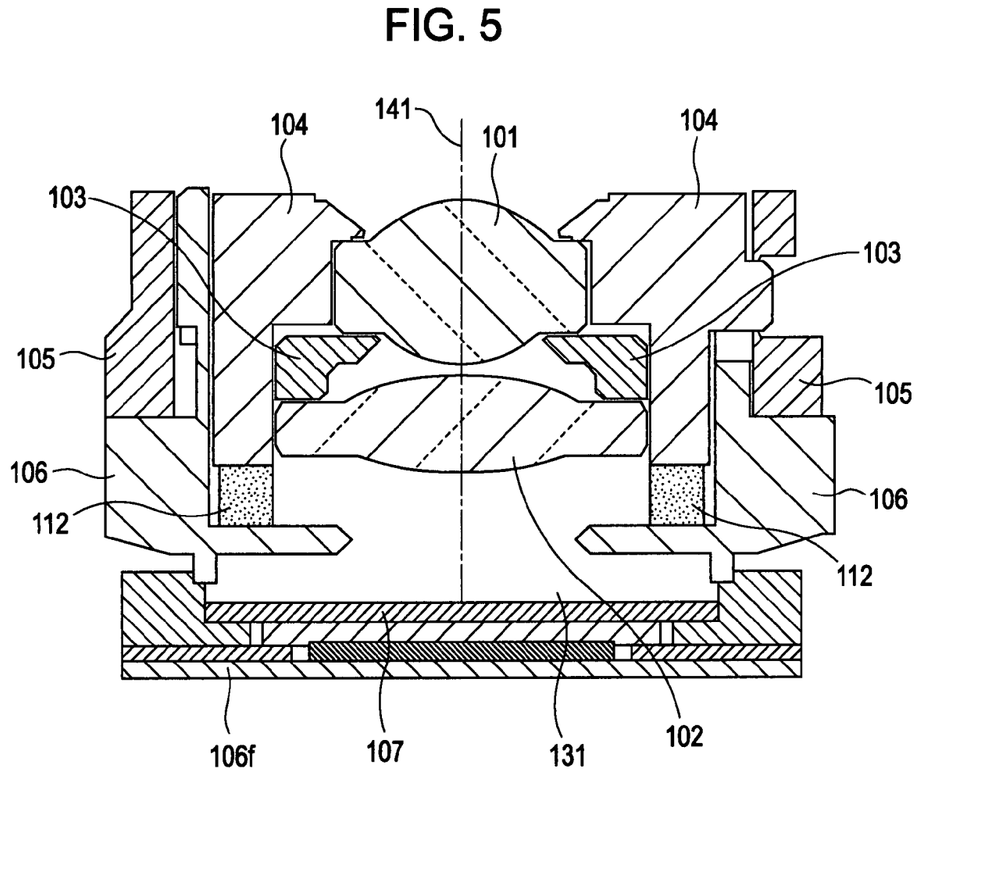
FIG. 5 is a different sectional view of the image pickup apparatus shown in FIG. 3.

FIG. 5 is a sectional view corresponding to FIG. 4 when an elastic member 112 is used instead of the elastic member 111. In this modification, the elastic member 112 with a rectangular section is used.

Figure 6:
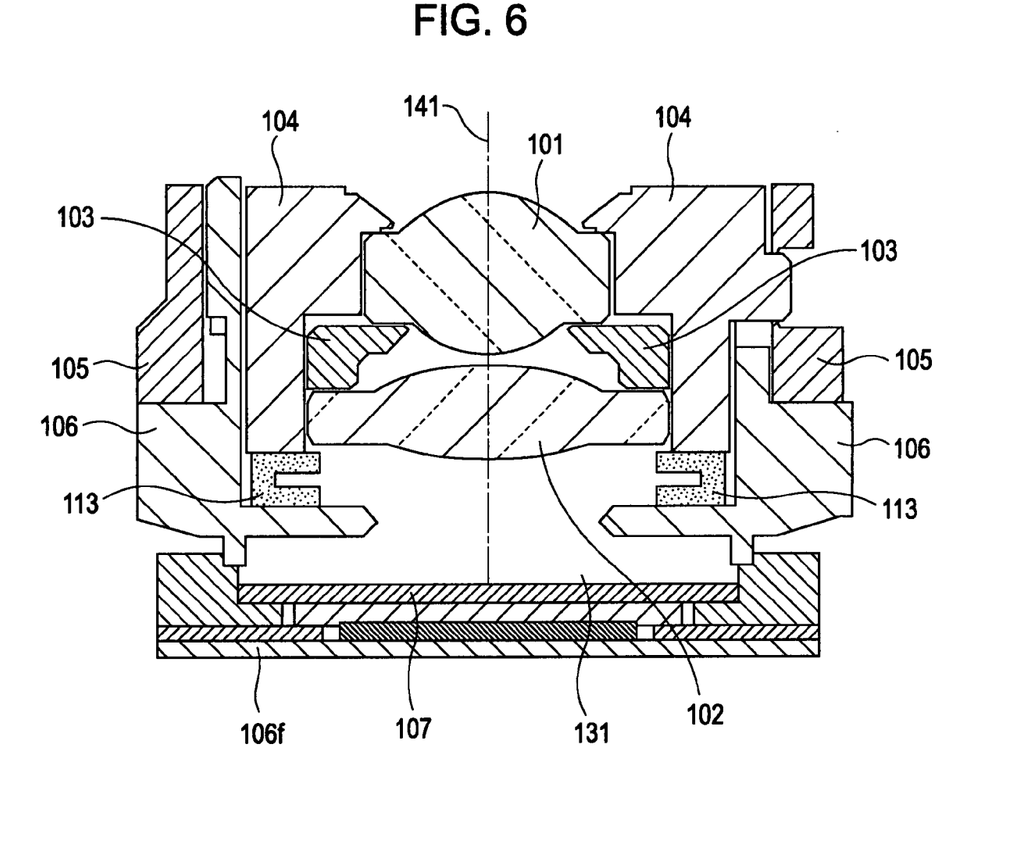
FIG. 6 is another different sectional view of the image pickup apparatus shown in FIG. 3.

FIG. 6 is a sectional view corresponding to FIG. 4 when an elastic member 113 is used instead of the elastic member 111. In this modification, the elastic member 113 with a horse-shoe-shaped section is used.

Figure 7:
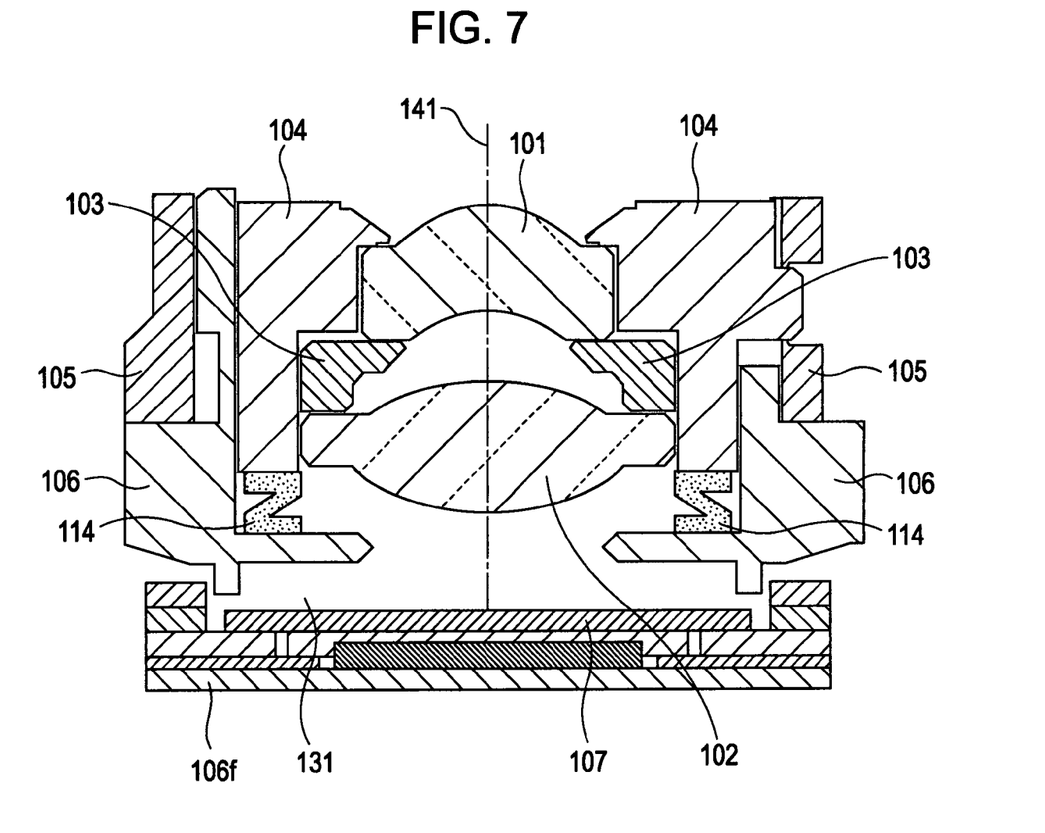
FIG. 7 is another different sectional view of the image pickup apparatus shown in FIG. 3.

FIG. 7 is a sectional view corresponding to FIG. 4 when an elastic member 114 is used instead of the elastic member 111. In this modification, the elastic member 114 with a Z-shaped section is used.

In the modifications shown in FIGS. 5 to 7, in the same way as in FIG. 4, the clearance between the lens frame 104 and the pedestal base 106 is sealed with the respective elastic members 112 to 114 so as to hermetically seal the space 131 between the image pickup device 107 and the second lens 102, thereby suppressing the penetration of dust into the space 131.

Figure 8:
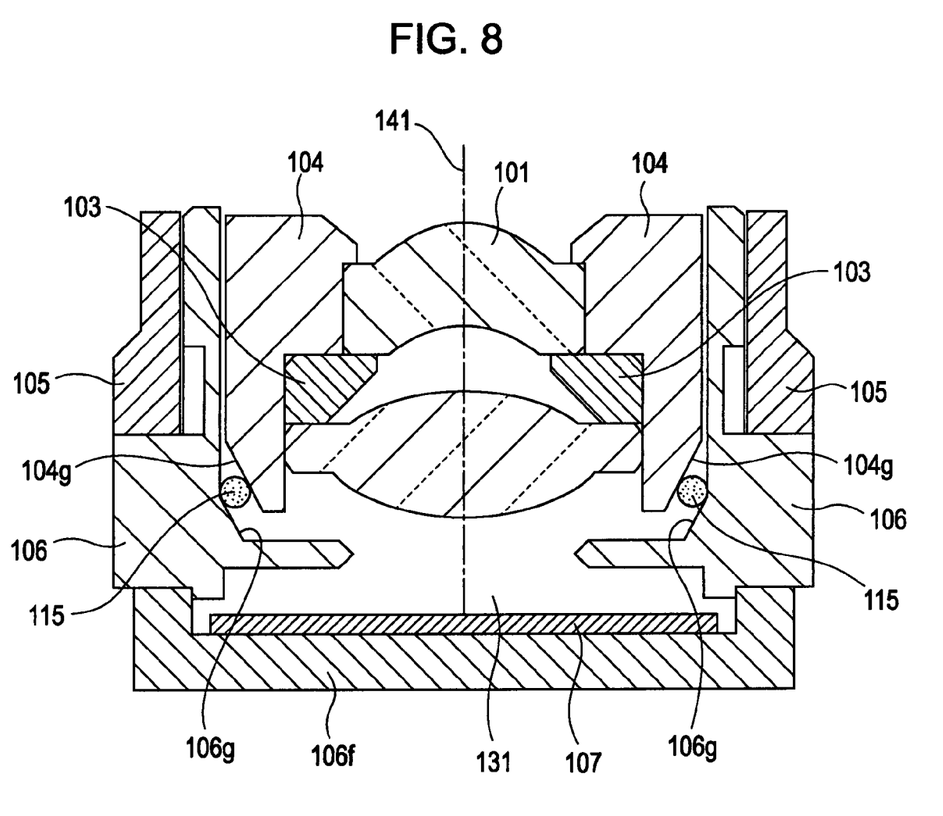
FIG. 8 is another different sectional view of the image pickup apparatus shown in FIG. 3.

Alternatively, as shown in FIG. 8, another elastic member further different from those of FIGS. 4 to 7 may be used by changing shapes of the pedestal base 106 and the lens frame 104. In this modification of FIG. 8, the pedestal base 106 and the lens frame 104 are shaped to have similar angular inclinations on an internal surface 106g of the pedestal base 106 facing an external surface of the lens frame 104 and on the external surface 104g of the lens frame 104, respectively. An elastic member 115 with a circular section is inserted into between the surface 106g and the surface 104g so as to abut them.

In the modification of FIG. 8, when the lens frame 104 moves in the optical axial direction, the elastic member 115 is not only being compressed but also rolls along the inclinations of the surface 106g and the surface 104g. By such a manner, the elastic member deterioration in elasticity can be suppressed, enabling the positioning of the imaging optical system in the optical axial direction to be more securely executed.

In addition thereto, the elastic member may also be optimally shaped in accordance with the image pickup apparatus structure such as the material of the elastic member and the weight of the lens frame.

Figure 9:
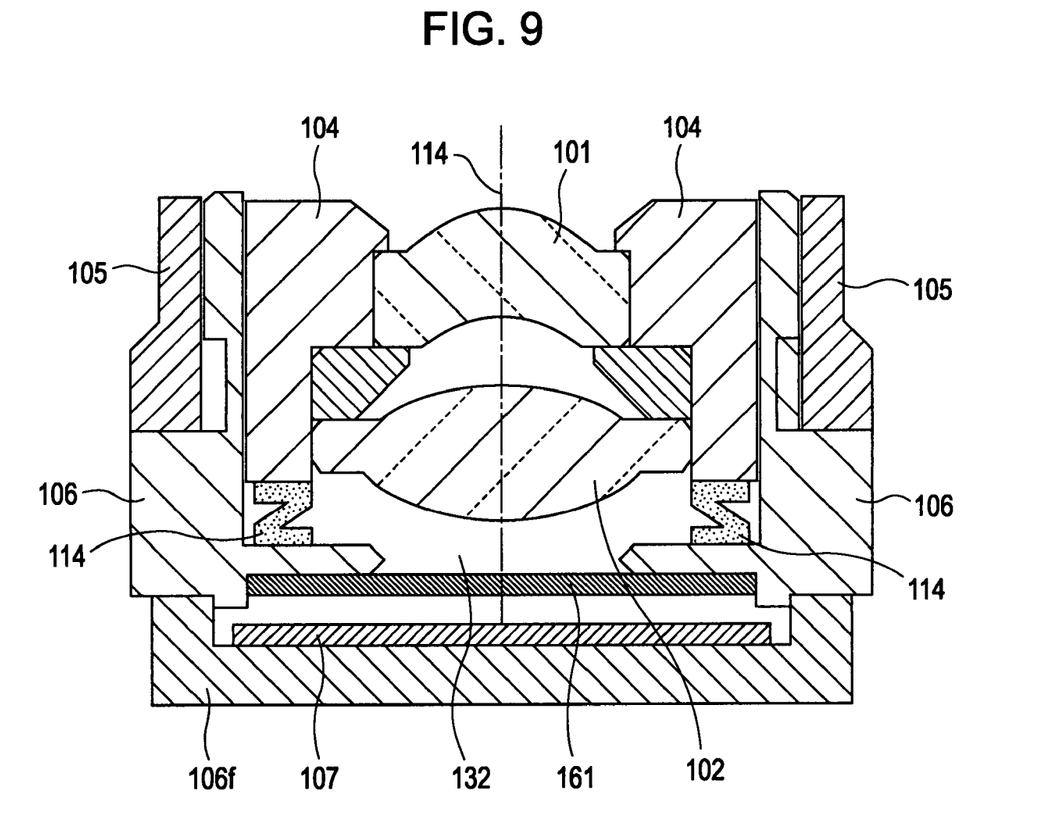
FIG. 9 is another different sectional view of the image pickup apparatus shown in FIG. 3.

Depending on the configuration of the image pickup apparatus, a filter, such as an infrared filter, may be provided on the image pickup device for taking natural color images. FIG. 9 is a sectional view corresponding to FIG. 4 of the image pickup apparatus having the filter. Referring to the drawing, a filter 161 fixed on the pedestal base 106 is provided between the second lens 102 and the image pickup device 107. Even in such a structure, by applying the embodiment of the present invention, the clearance between the lens frame 104 and the pedestal base 106 is sealed with the elastic member 114 so as to hermetically seal a space 132 between the filter 161 and the second lens 102, thereby suppressing the penetration of dust into the space 132.

In this modification, the elastic member 114 is exemplified; however, the other elastic members mentioned above may also be included.

As described above, the image pickup apparatus 100 according to the embodiment of the present invention can be mounted on a small portable electronic instrument. FIGS. 10A and 10B are drawings illustrating an example of the mobile phone 200 having the image pickup apparatus 100 mounted thereon; FIG. 10A is a front view of the mobile phone 200 viewed from the operation side; and FIG. 10B is a drawing viewed from the backside of the mobile phone 200.

The mobile phone 200 is provided with a hinge arranged at the center so as to be collapsible. As shown in FIG. 10A, the mobile phone 200 is composed of an upper part 201 having a display unit 221 including a display and a lower part 202 having an operation unit including buttons.

When the image pickup apparatus 100 is mounted on the mobile phone 200, as shown in FIG. 10B, the first lens 101 is provided to expose itself on the backside of the upper part 201. The image pickup apparatus 100 is structured to have a thickness small (thin) enough in comparison with that of the mobile phone 200, so that by mounting the image pickup apparatus 100 thereon, the constraint, such as the degree of freedom in external design of the mobile phone 200, may not be imposed.

By mounting the image pickup apparatus 100 according to the embodiment of the present invention on the mobile phone 200 in such a manner, beautiful images can be simply picked up with high image quality at a place away from home for example. The picked-up images can also be transmitted to another mobile phone or a personal computer by using a communication function of the mobile phone 200. As a result, information including high quality images can be utilized more conveniently with low cost.

It should be understood by those skilled in the art that various modifications, combinations, sub-combinations and alterations may occur depending on design requirements and other factors insofar as they are within the scope of the appended claims or the equivalents thereof.

The invention claimed is:

1. An image pickup apparatus comprising:
    an imaging optical system operative to adjust a focal position of images corresponding to light incident from a lens;
    a frame arranged movably in an optical axial direction of light incident to the imaging optical system for fixing the imaging optical system by covering the periphery of the imaging optical system;
    a drive unit operative to move the frame in the optical axial direction to an arbitrary position within a predetermined range;
    an image pickup device operative to receive light incident through the imaging optical system so as to output a signal corresponding to the received light; and
    urging means inserted between a pedestal base having the image pickup device attached thereto and the frame for urging the frame in the optical axial direction as well as in a direction remote from the image pickup device and for sealing a space formed between a lower portion of the imaging optical system and the image pickup device so as to prevent dust from entering said space.

2. The apparatus according to claim 1, wherein the urging means includes an elastic member with predetermined elasticity.

3. The apparatus according to claim 2, wherein the elastic member is made of cyclized rubber.

4. The apparatus according to claim 3, wherein the rubber includes a spring built therein.

5. The apparatus according to claim 2, wherein the elastic member is made of cyclized and foamed rubber.

6. The apparatus according to claim 1, wherein the urging means is inserted between a surface of the pedestal base, on which the image pickup device is attached, and an end face of the frame adjacent to the image pickup device.

7. An image pickup apparatus comprising:
    an imaging optical system operative to adjust a focal position of images corresponding to light incident from a lens;
    a frame arranged movably in an optical axial direction of light incident to the imaging optical system for fixing the imaging optical system by covering the periphery of the imaging optical system;
    a drive unit operative to move the frame in the optical axial direction to an arbitrary position within a predetermined range;
    an image pickup device operative to receive light incident through the imaging optical system so as to output a signal corresponding to the received light; and
    urging means inserted between a pedestal base having the image pickup device attached thereto and the frame for urging the frame in the optical axial direction as well as in a direction remote from the image pickup device,
    wherein the frame is shaped to gradually reduce the diameter of part of the frame, and the part of the frame is inserted into part of the pedestal base, and
    wherein the urging means is inserted between the part of the frame surface and an inclined surface shaped on the pedestal base.

8. A mobile phone comprising an image pickup apparatus built therein, wherein the image pickup apparatus includes:
    an imaging optical system operative to adjust a focal position of images corresponding to light incident from a lens;
    a frame arranged movably in an optical axial direction of light incident to the imaging optical system for fixing the imaging optical system by covering the periphery of the imaging optical system;
    a drive unit operative to move the frame in the optical axial direction to an arbitrary position within a predetermined range;
    an image pickup device operative to receive light incident through the imaging optical system so as to output a signal corresponding to the received light; and
    urging means inserted between a pedestal base having the image pickup device attached thereto and the frame for urging the frame in the optical axial direction as well as in a direction remote from the image pickup device and for sealing a space formed between a lower portion of the imaging optical system and the image pickup device so as to prevent dust from entering said space.

9. The apparatus according to claim 1, wherein the urging means hermetically seals said space.

10. The mobile phone according to claim 8, wherein the urging means hermetically seals said space.

* * * * *